US009640660B2

(12) United States Patent
Yin et al.

(10) Patent No.: US 9,640,660 B2
(45) Date of Patent: May 2, 2017

(54) ASYMMETRICAL FINFET STRUCTURE AND METHOD OF MANUFACTURING SAME

(71) Applicant: Institute of Microelectronics, Chinese Academy of Sciences, Beijing (CN)

(72) Inventors: Haizhou Yin, Poughkeepsie, NY (US); Keke Zhang, Liaocheng (CN)

(73) Assignee: INSTITUTE OF MICROELECTRONICS, CHINESE ACADEMY OF SCIENCES, Beijing (CN)

( * ) Notice: Subject to any disclaimer, the term of this patent is extended or adjusted under 35 U.S.C. 154(b) by 0 days.

(21) Appl. No.: 14/900,594

(22) PCT Filed: Oct. 21, 2013

(86) PCT No.: PCT/CN2013/085537
§ 371 (c)(1),
(2) Date: Dec. 21, 2015

(87) PCT Pub. No.: WO2015/054914
PCT Pub. Date: Apr. 23, 2015

(65) Prior Publication Data
US 2016/0149027 A1 May 26, 2016

(30) Foreign Application Priority Data
Oct. 14, 2013 (CN) .......................... 2013 1 0478425

(51) Int. Cl.
*H01L 29/78* (2006.01)
*H01L 29/66* (2006.01)
(Continued)

(52) U.S. Cl.
CPC ........ *H01L 29/785* (2013.01); *H01L 29/0649* (2013.01); *H01L 29/0688* (2013.01);
(Continued)

(58) Field of Classification Search
CPC ......... H01L 29/66545; H01L 29/66818; H01L 29/401; H01L 29/0649; H01L 29/0688; H01L 29/785
See application file for complete search history.

(56) References Cited

U.S. PATENT DOCUMENTS 5,869,359 A * 2/1999 Prabhakar ......... H01L 29/41733
257/E21.415
2005/0269629 A1 12/2005 Lee et al.
(Continued)

FOREIGN PATENT DOCUMENTS

| CN | 103779217 | 5/2014 |
| JP | 2008-192819 | 8/2008 |
| WO | WO-2013/095550 | 6/2013 |

OTHER PUBLICATIONS

International Search Report on PCT/CN2013/085537 dated Jul. 23, 2014.

*Primary Examiner* — Walter H Swanson
(74) *Attorney, Agent, or Firm* — Meng H. Pua; Foley & Lardner LLP

(57) ABSTRACT

A method of fabricating an asymmetric FinFET is provided in the invention, comprising: a. providing a substrate (101); b. forming a fin (102) on the substrate (101), wherein the width of the fin (102) is defined as a second channel thickness; c. forming a shallow trench isolation; d. forming a sacrificial gate stack on the top surface and sidewalls of the channel which is in the middle of the fin, and forming source/drain regions in both ends of the fin; e. depositing an interlayer dielectric layer to cover the sacrificial gate stack and the source/drain regions, planarizing the interlayer dielectric layer to expose sacrificial gate stack; f. removing the sacrificial gate stack to expose the channel; g. forming an etch-stop layer (106) on top of the channel; h. covering a photoresist film (400) on a portion of the semiconductor (Continued)

structure near the source region; i. thinning the channel which is not covered by the photoresist layer (400) from both direction vertical to the channel sidewalls until a first channel thickness obtained; j. removing the etch-stop layer (106). Harmful short channel effects can be restrained and device performance can be enhanced.

20 Claims, 7 Drawing Sheets

(51) Int. Cl.
     *H01L 29/06*      (2006.01)
     *H01L 29/40*      (2006.01)

(52) U.S. Cl.
     CPC ...... *H01L 29/401* (2013.01); *H01L 29/66545* (2013.01); *H01L 29/66818* (2013.01)

(56) References Cited

U.S. PATENT DOCUMENTS

| | | | |
|---|---|---|---|
| 2009/0321843 A1* | 12/2009 | Waite | H01L 21/823807 257/369 |
| 2012/0302025 A1* | 11/2012 | Yin | H01L 29/4966 438/287 |
| 2013/0126981 A1 | 5/2013 | Ho et al. | |
| 2014/0252477 A1* | 9/2014 | Tseng | H01L 29/66795 257/347 |

* cited by examiner

ASYMMETRICAL FINFET STRUCTURE AND METHOD OF MANUFACTURING SAME

CROSS REFERENCE TO RELATED APPLICATION

This application is a national stage application, filed under 35 U.S.C. §371, of PCT Application No. PCT/CN2013/085537, filed on Oct. 21, 2013, entitled "ASYMMETRIC FINFET STRUCTURE AND METHOD OF MANUFACTURING SAME", which claimed priority to Chinese Application No. 201310478425.9, filed on Oct. 14, 2013, all of which are hereby incorporated by reference in their entireties.

TECHNICAL FIELD

The present disclosure generally relates to a semiconductor device and a method of fabricating the same, and in particular, to an asymmetrical FinFET and a method of fabricating the same.

BACKGROUND

With dimensional scaling of semiconductor device, threshold voltage decreases with the reduction of channel length, that is to say, short channel effects arise in semiconductor device. Fin Field Effect Transistor, i.e. FinFET is developed to face challenges from semiconductor design and manufacture.

In a FinFET structure, it is desirable to have a channel region as thin as possible to improve the gate control of the channel and restrain short channel effects. However, while channel thickness is less than 10 nm, carrier mobility will decrease with the reduction of channel thickness, which may deteriorate device performance seriously. Specially, a portion of the channel near the source side may be affected severely, while in the drain side, channel thickness will play a minor role in carrier mobility due to a saturation effect caused by high electric field.

Drain Induction Barrier Lower (DIBL) is an non-ideal effect of short channel devices, that is to say, when channel length decreases, source-drain voltage may increase such that P-N junction depletion regions of source and drain becomes closer and electric line in channel may punch through from source to drain, which may cause decrease of potential barrier in source side and increase of carriers from source to channel and thereby lead to increase of current in drain side. With further reduction of channel length, threshold voltage of transistors may decrease due to increasingly severe DIBL effects, which may result in decrease of device voltage gain and restrict improvement of integration level of Very Large Scale Integrated Circuits (VLSIC). It is desirable to have a channel thickness, specially the channel thickness near the drain side as thinner as possible to depress DIBL effects.

Therefore, an asymmetric FinFET device and method of fabricating the same are provided to balance the effects on carrier mobility and DIBL by channel thickness and improve device performance as well. Specifically, the thickness of the portion of the channel near the source side is 1-3 times the thickness near the drain side, and the length of the relative thin portion of the channel is 1-3 times the length of the relative thicker portion. That is to say, the channel has a larger thickness near the source side in regard of the effects by carrier mobility by channel thickness; while in the drain side, because the channel width has a small effect on carrier mobility, the channel has a smaller thickness to suppress effects of DIBL. Comparing with the prior art, the harmful effects of short channel effects can be effectively restrained by the present invention and the device performance can be improved.

SUMMARY

An asymmetric FinFET and a method for fabricating the same is provided in the present invention in order to suppress short channel effects and improve device performance. Specifically, a method of fabricating an asymmetric FinFET is provided, comprising: a. providing a substrate; b. forming a fin on the substrate, wherein the width of the fin is defined as a second channel thickness; c. forming a shallow trench isolation; d. forming a sacrificial gate stack on the top surface and sidewalls of a channel region which is in the middle of the fin, and forming source/drain regions in both ends of the fin; e. depositing an interlayer dielectric layer to cover the sacrificial gate stack and the source/drain regions, planarizing the interlayer dielectric layer to expose the sacrificial gate stack; f. removing the sacrificial gate stack to expose the channel region; g. forming an etch-stop layer on the top of the channel; h. covering a photoresist film on a portion of the semiconductor structure near the source region; i. thinning the a portion of the channel which is not covered by the photoresist layer from both directions vertical to the channel sidewalls until a first channel thickness obtained; j. removing the etch-stop layer.

Optionally, in step g, the etch-stop layer may be formed by forming a P-type heavily doped region on the top of the channel region. The heavily doped region may be formed by ion implantation, the ions that are implanted may comprise BF2, the doping concentration is $1e19\ cm^{-3} \sim 5e19\ cm^{-3}$, and the implantation depth may is 10 nm.

Optionally, step g may be performed before step b, that is to say, the step that the etch-stop layer being formed on the top of the channel is prior to the fin's formation. Optionally, the etch-stop layer is formed by mask deposition.

Optionally, in step h, range of the portion of the semiconductor structure which is covered is $\frac{1}{4} \sim \frac{1}{2}$ channel length along the direction from the borderline of the source region along the direction from the source region to the channel region.

Optionally, in step i, the channel may be thinned by isotropically etching the exposed channel sidewalls.

Optionally, in step i, the channel may be thinned by oxidating the exposed channel sidewalls.

Another method of fabricating an asymmetric FinFET is also provided in the present invention, comprising: a. providing a substrate; b. forming a cap layer on top of a portion of the substrate which is defined as a channel region; c. forming a fin from the substrate, wherein the channel region is contained in the fin and the width of the fin is defined as a first channel thickness; d. forming an shallow trench isolation; e. forming a sacrificial gate stack on the top surface and sidewalls of the channel region which is in the middle of the fin, and forming source/drain regions in both ends of the fin; f. depositing an interlayer dielectric layer to cover the sacrificial gate stack and the source/drain regions, planarizing the interlayer dielectric layer to expose the sacrificial gate stack; g. removing the sacrificial gate stack to expose the channel region; h. forming a mask on the sidewalls of the channel region near the drain region; i. epitaxially growing a semiconductor layer from the exposed sidewalls of the channel region from both directions vertical to the channel sidewalls until a second channel thickness obtained; j. removing the cap layer.

Optionally, in step b, the cap layer may be formed by mask deposition.

Optionally, in step h, length of a portion of the semiconductor structure which is not covered by the mask is ¼~½ channel length from the borderline of the source region along the direction from the source region to the channel region.

Optionally, the first channel thickness may be 5~10 nm, the second channel thickness may be 10~20 nm.

Optionally, subsequent to the step j the method may further comprise step p: depositing a gate dielectric material, a work-function tuning material and a gate metal material.

Accordingly, an asymmetric FinFET is provided in the present invention, comprising: a substrate; a fin on the substrate; a shallow trench isolation on the substrate, deposited on both sides of the fin; an interlayer dielectric layer covering the shallow trench isolation; a gate stack intersecting with the fin and covering the middle of the fin; source/drain regions in both ends of the fin; and a channel region under the gate stack, deposited in the middle of the fin; wherein, the thickness of the channel near the source region is 1-3 times the thickness near the drain region.

According to the asymmetric FinFET provided by the present invention, the main consideration is the effect which is imposed by the channel thickness to carrier mobility in the region near the source region, and a large channel thickness is preferred accordingly; while in the drain region, carrier mobility is not affected mainly by channel thickness, and a narrow channel thickness is preferred accordingly to decrease DIBL effect. Comparing with the prior art, the harmful effects of short channel effect can be effectively restrained by the present invention and the device performance can be enhanced.

BRIEF DESCRIPTION OF THE DRAWINGS

Identical or similar numbers indicate identical or similar elements of the semiconductor structure.

DETAILED DESCRIPTION

Figure 12:
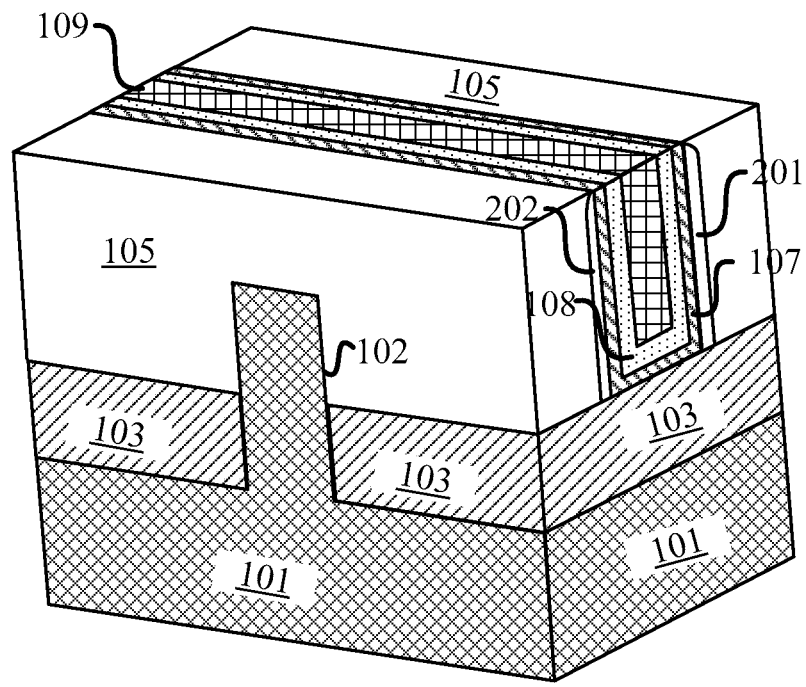

Referring to FIG. 12, a FinFET structure is provided, comprising: a semiconductor substrate 101;

a fin 102 formed on the substrate 101;

a shallow trench isolation 103 on the substrate 101, deposited on both sides of the fin 102;

an interlayer dielectric layer 105 covering the shallow trench isolation 103;

a gate stack intersecting with the fin 102 and covering the middle of fin 102;

source/drain regions in both ends of the fin (102); and a channel region 300 under the gate stack, deposited in the middle of the fin 102;

wherein, the thickness of the channel region 300 near the source region is 1-3 times the thickness near the drain region.

Optionally, the length of the thicker portion of the channel region is ¼~⅔ times the total channel length.

The substrate 101 comprises a Si substrate (for example, a Si chip). Optionally, the substrate 101 may comprise variety doping configurations. In other embodiments, the substrate may comprise other basic semiconductor materials, such as, Ge or compound semiconductors, for example, SiC, GaAS, InAs or InP. Identically, the substrate 101 may range in, but not limited to, thickness of hundreds of micro meters, for example, from 400 um to 800 um.

The fin 102 is formed by etching the substrate 101, and has the same material and crystal orientation as the substrate 101, normally, the length of the fin 102 is 80-200 nm and the thickness is 30-50 nm. The source/drain regions are deposited in both ends of the fin 102 and have the same length. The channel region is in the middle part of the fin 102 and deposited between the source/drain regions. In the present invention, the thickness of the channel region near the source region is 1-3 times the thickness near the drain region, and the length of the thicker portion of the channel is ¼~⅔ times the total channel length. According to the asymmetric FinFET provided by the present invention, the main consideration is the effect which is imposed by channel thickness to carrier mobility in the region near the source region, and a large channel thickness is preferred accordingly; while in the drain region, carrier mobility is not affected mainly by channel thickness, and a narrow channel thickness is preferred accordingly to decrease DIBL effects. Comparing with the prior art, the harmful effects of short channel effect can be effectively restrained by the present invention and the device performance can be enhanced.

A gate dielectric layer 107 preferably may comprise silicon oxynitride, silicon nitride or high-k materials. The equivalent oxide thickness of the gate dielectric layer 107 may be 0.5~5 nm.

The gate stack structure may comprise a conductive gate electrode stack and a pair of sidewalls 201 on both sides of the gate electrode stack. The gate electrode stack may comprise only a metal electrode, or a composite metal/polysilicon electrode. If the gate stack comprise a polysilicon layer, there may be a silicide layer on the top of the polysilicon layer.

More details of the present invention will be described in the following with reference to the attached drawings. In the drawings identical elements are indicated by identical or similar numbers. Each part of the drawings is not drawn to scale for purpose of clarity.

It could be understood that, while describing device structures, when a layer/element is recited as being "on" a further layer/element, the layer/element can be disposed directly on the further layer/element, or otherwise there may be an intervening layer/element interposed there between. Further, if a layer/element is "on" a further layer/element in an orientation, then the layer/element can be "under" the further layer/element when the orientation is turned.

To describe a situation such as directly on another layer, another area, "on . . . " or "on . . . and adjacent to" is adopted in the specification.

Many particular details according to the present invention are described in the following, for example, device structure, material, dimension, operation process and technique, for purpose of clarity and comprehension. Those skilled in the art may understand the invention can be practiced by modifications and revisions not limited to the particular details. For example, a semiconductor material for the substrate and fin can be chosen from group IV semiconductors, such as Si or Ge, or groups III-V semiconductors, such as GaAs, InP, GaN, Si, or a stack of the foregoing semiconductor materials.

In the specification, the term "etch-stop layer" is defined as a layer which has a lower etching rate compared with the specific semiconductor layer which is expected to be etched out. A specific semiconductor layer can be etched selectively taking advantage of the etching rate difference between the etch-stop layer and the specific semiconductor layer. A etch-stop layer may comprise a heavily doped (fox example, a doping concentration larger than 5e19 $cm^{-3}$) P-type semiconductor or SiGe, in which the doping ion may be at least any one selected from a group of B, Al, Ga, In and Tl.

Embodiment 1 of the present invention is described in detail with reference to the drawings in the following. It must be noted that, in each embodiment of the present invention, there is no need to plotting the drawings to scale because the drawings are used for purpose of demonstrating.

Figure 1:
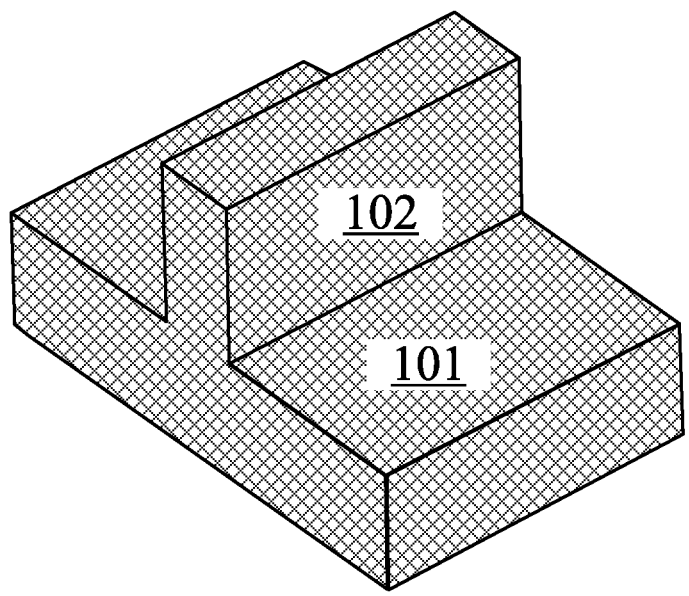
FIGS. 1-4, 6, 8-9 and 12 are 3-D isometric drawings schematically illustrating some steps for fabricating the semiconductor structure in accordance with embodiment 1 of the present disclosure.

Referring to FIG. 1, a fin 102 is intended to be fabricated on the substrate 101. The substrate 101 and fin 102 are formed by silicon only for purpose of exampling. The fin 102 is formed by epitaxially growing and later etching a semiconductor layer on the substrate 101, and the method for epitaxially growing may be molecular beam epitaxy (MBE) or other methods, the method for etching may be dry etching or dry/wet etching. Optionally, the fin width is larger than expected channel thickness. In the embodiment, the channel thickness may be 30~50 nm, for example, 35 nm, 40 nm or 45 nm.

Figure 2:
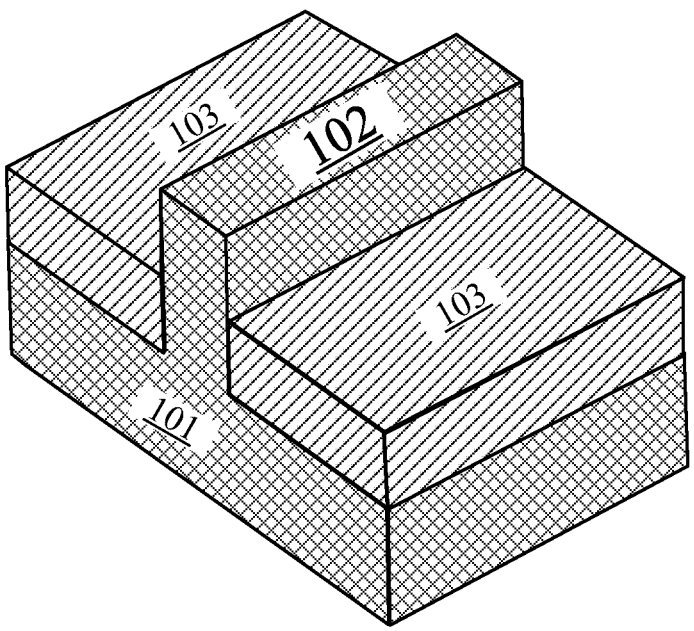

Subsequent to the formation of the fin 102, a shallow trench isolation is made on the substrate 101. Preferably, a nitride and a buffer $SiO_2$ pattern are formed on the substrate as a mask of later trench etching with the exposure of the fin 102. Afterwards, a trench with a specific depth and sidewall angle is formed by etching the substrate 101. And then a thin $SiO_2$ layer is grown to smooth the corner angle and remove the damages in the surface of the silicon which are induced in the etching process. Then the trench is filled and annealed subsequent to the oxidation process. Then the surface of the semiconductor structure formed by foregoing process is planarized using a CMP process with the nitride layer as an etch-stop layer. After the CMP process, the exposed nitride layer is etched by hot phosphoric acid. At last, a sacrificial oxide is grown and rinsed later to remove the defects and damages in the surface of the silicon. The semiconductor structure after the shallow trench isolation formed is shown in FIG. 2.

Next, a sacrificial gate stack 200 is formed on the channel region, which following with the source/drain regions formation. The sacrificial gate stack 200 may comprise a single layer, or a multiple layer. The sacrificial gate stack 200 may comprise variety materials, such as polymer, amorphous silicon, polysilicon or TiN, and range in thickness from 10~100 nm. Oxidation, Chemical vapor deposition (CVD), and Atomic layer deposition (ALD), etc., can be employed to fabricate the sacrificial gate stack 200. The source/drain regions may be made by ion implantation following with annealling to active ions, or doping in situ followed by epitaxially growing or a combination thereof.

Optionally, sidewall spacers 201 and 202 are formed on the sidewalls of the sacrificial gate stack to isolate adjacent gate electrodes. The sidewall spacers 201 and 202 may comprise any one from a group including silicon nitride, silicon oxide, silicon oxynitride and silicon carbide or any combination thereof, and/or other appropriate materials. The sidewall spacers 201 and 202 may be a multilayer structure.

The sidewall spacers 201 and 202 may be formed by processes including deposition and etching, with a thickness range of 10~100 nm, for example, 30 nm, 50 nm, or 80 nm.

Figure 3:
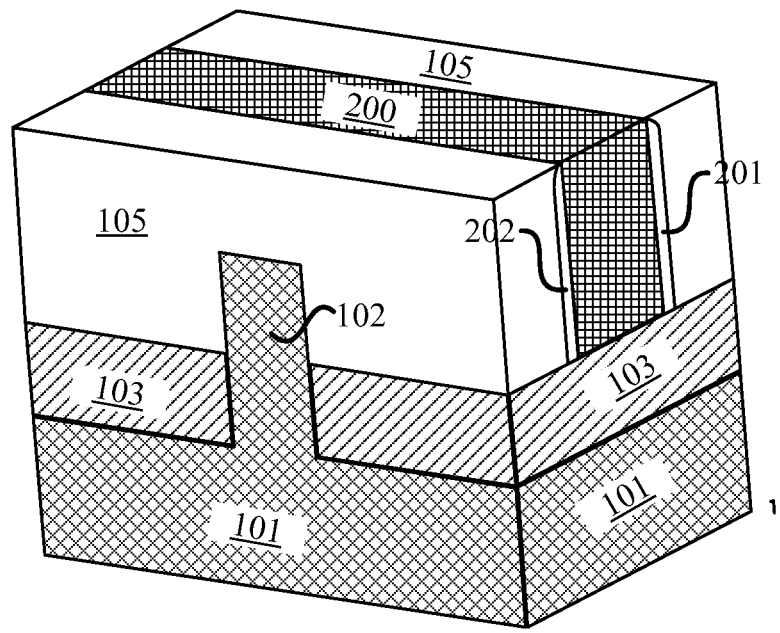

Next, an interlayer dielectric layer 105 is deposited and planarized, as a result, the sacrificial gate stack 200 is exposed. Specifically, the interlayer dielectric layer 105 may be formed by CVD, high density plasma CVD, spin coating or other appropriate methods. The interlayer dielectric layer 105 may comprise any one selected from a group including $SiO_2$, carbon doped $SiO_2$, BPSG, PSG, UGS, silicon oxynitride and low-k materials or anyone of the combination thereof. The interlayer dielectric layer 105 may have a thickness range of 40~150 nm, for example, 80 nm, 100 nm or 120 nm. Referring to FIG. 3, a planarization process is performed to expose the sacrificial gate stack 200 which may level with the interlayer dielectric layer 105 (the term "level with" is defined as that, the height difference between two elements is in allowed range of the process deviation in semiconductor manufacture).

Figure 4:
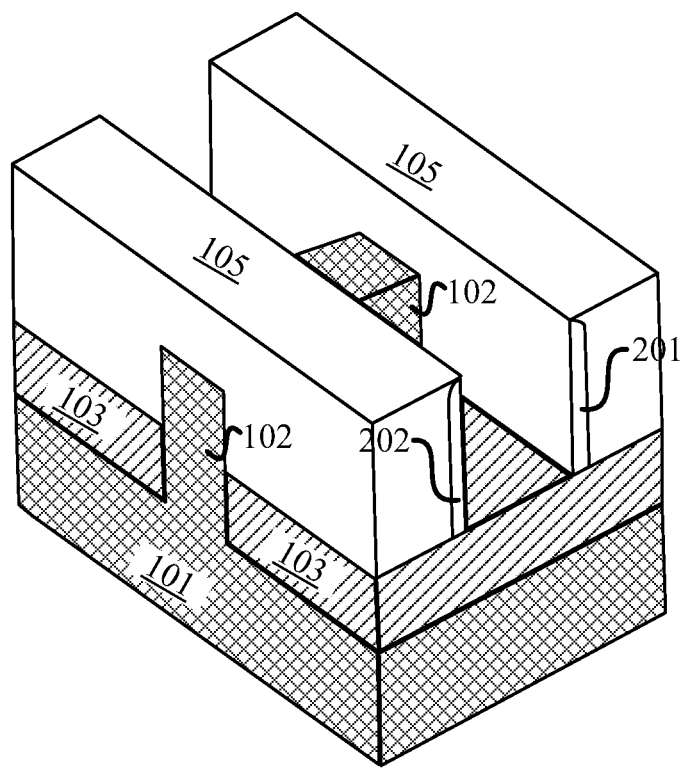
Figure 5:
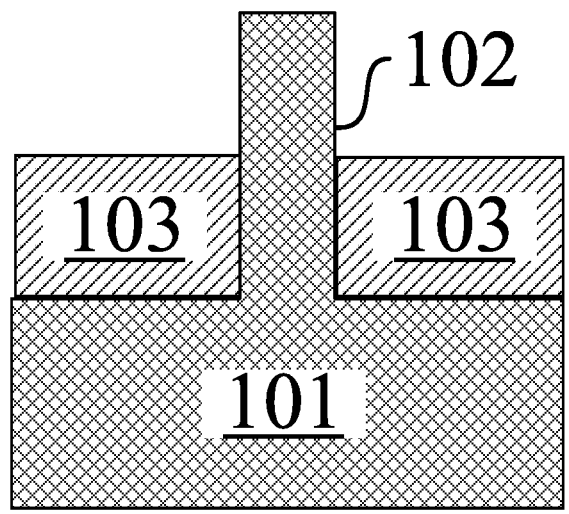
FIGS. 5, 7, 10 and 13 are schematic views illustrating some steps for fabricating a semiconductor structure in accordance with embodiment 1 of the present disclosure.

Next, referring to FIG. 4, the sacrificial gate stack is removed and the channel region is exposed. Specifically, the sacrificial gate stack may be removed by wet etching and/or dry etching. In one embodiment, plasma etching may be used. FIG. 5 is a sectional view of the semiconductor structure in FIG. 4 along the direction vertical to the channel.

Figure 6:
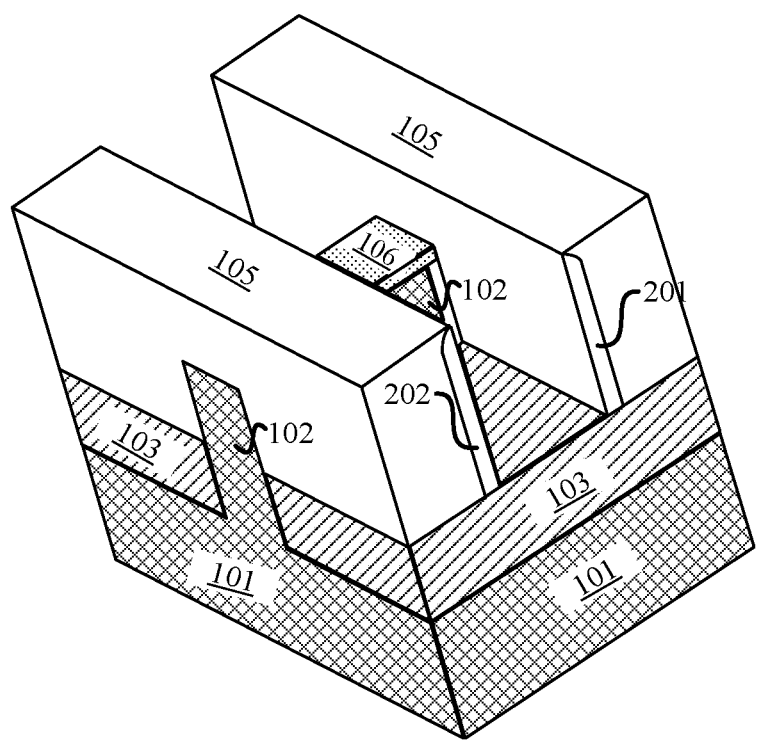
Figure 7:
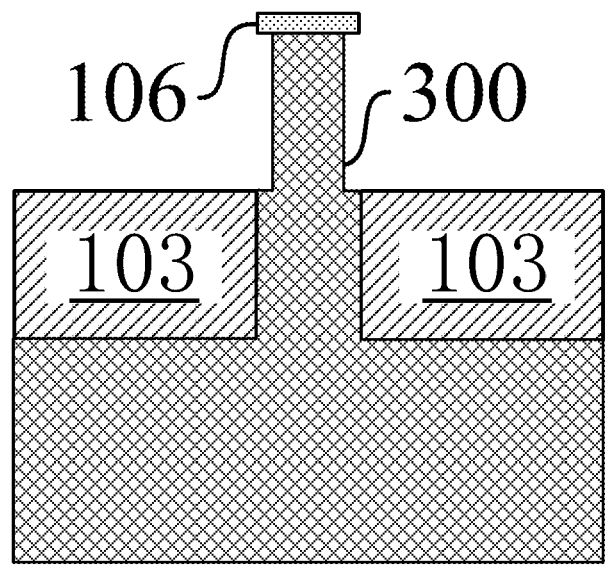

Next, an etch-stop layer 106 is formed on the top of the channel region. The etch-stop layer may be formed by steps including forming a P-type doped region with a certain thickness on the top of the channel region. The doped region may be made by ion implantation or other methods, for example, $BF_2$ ions are implanted into the top of the channel region, and the doping concentration is 1e19 $cm^{-3}$~5e19 $cm^{-3}$, for example, 3e19 $cm^{-3}$, the implantation depth is 6~15 nm, for example, 8 nm, 10 nm or 12 nm. The semiconductor structure formed after the etch-stop layer formation is shown in FIG. 6, and FIG. 7 is a sectional view of the semiconductor structure in FIG. 6 along the direction vertical to the channel. The etch-stop layer may also be formed before the fin 102 formation, for example, forming the etch-stop layer by mask deposition following with the fin 102 formation.

Next, the channel region is thinned from both directions vertical to the channel sidewalls until a second channel thickness obtained, preferably, the second channel thickness is 12~24 nm. Optionally, the method to thin the channel may be isotropic etching. In the embodiment, wet etching and/or dry etching may be employed to thin both sidewalls of the channel region, and the thickness reduced may be 8~15 nm, for example, 10 nm. Optionally, the method to thin the channel region may be oxidation, that is to say, thinning the channel by oxidizing the silicon into $SiO_2$ for a certain thickness on both sides of the channel region, and the thickness reduced may be 8~15 nm, for example, 10 nm.

Figure 8:
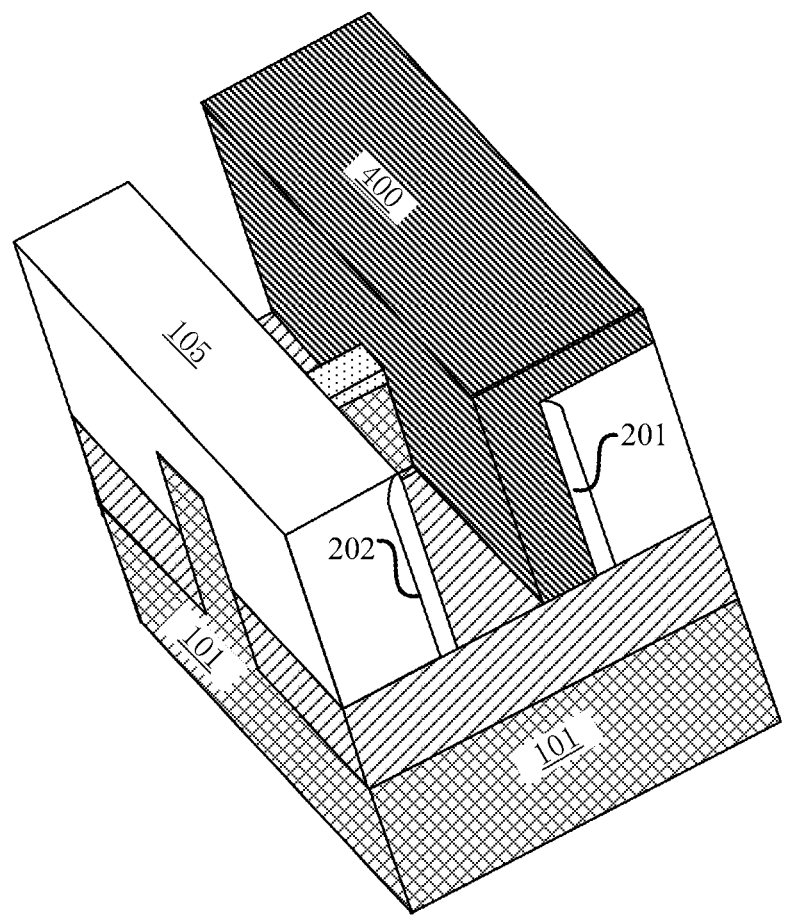

Subsequent to the channel thinning process, a photoresist film 400 is covered on the semiconductor structure in the source side. Specifically, a photoresist film is deposited on the semiconductor structure, exposed and developed later using a mask, and then the photoresist film 400 is isotropical etched and the photoresist film 400 in the drain side is removed to expose the drain region and channel region near the drain region which need to be thinned. Referring to FIG. 8, it is noted that, after the removing, the length of the portion of the semiconductor structure which is still covered is ¼~½ channel length from the borderline of the source region along the direction from the source region to the channel region.

Next, the channel part which is not covered by the photoresist film 400 is thinned from both directions vertical to the channel sidewalls until a first channel thickness obtained. Optionally, the first channel thickness is 6~12 nm. Alternatively, the thinning method may be isotropic etching. In the embodiment wet etching and/or dry etching may be employed, and the thinned thickness may be 6~12 nm, for example, 10 nm. Optionally, the thinning method may be oxidation, for example, the channel is thinned by oxidizing the silicon with a certain thickness on both sidewalls of the channel region to form $SiO_2$, and the thinned thickness may be 6~12 nm, for example, 10 nm.

Figure 9:
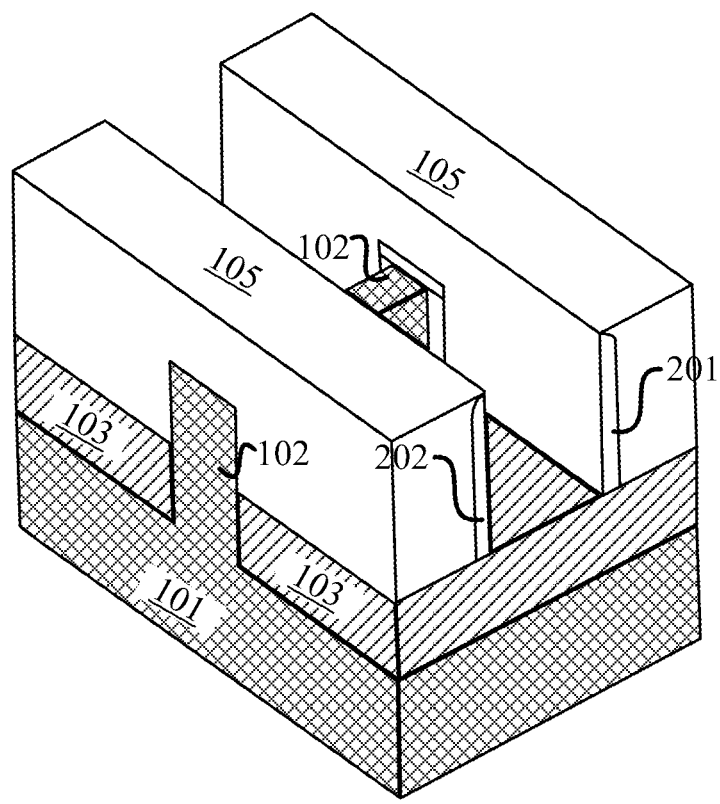
Figure 10:
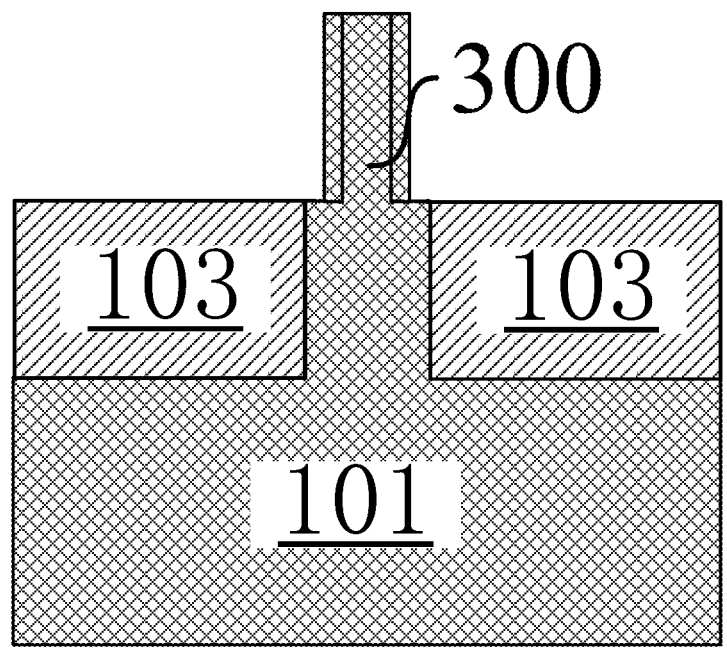

Next, the etch-stop layer 106 is removed. The etch-stop layer 106 may be removed by wet etching and/or dry etching. The agent for wet etching may comprise hydroxide solution (for example, ammonium hydroxide), deionized water or other appropriate etching solutions; dry etching may comprise plasma etching. The semiconductor structure formed after the etch-stop layer 106 removed is shown in FIG. 9. For purpose of showing a clearer channel region which has been thinned, FIG. 9 is a schematic sectional view showing the semiconductor structure in FIG. 8 along the direction vertical to the channel, while FIG. 10 is a schematic top view of the semiconductor structure in FIG. 8. It can be clearly seen that, the thickness of the channel region near the source side is smaller than the thickness near the drain side.

Figure 11:
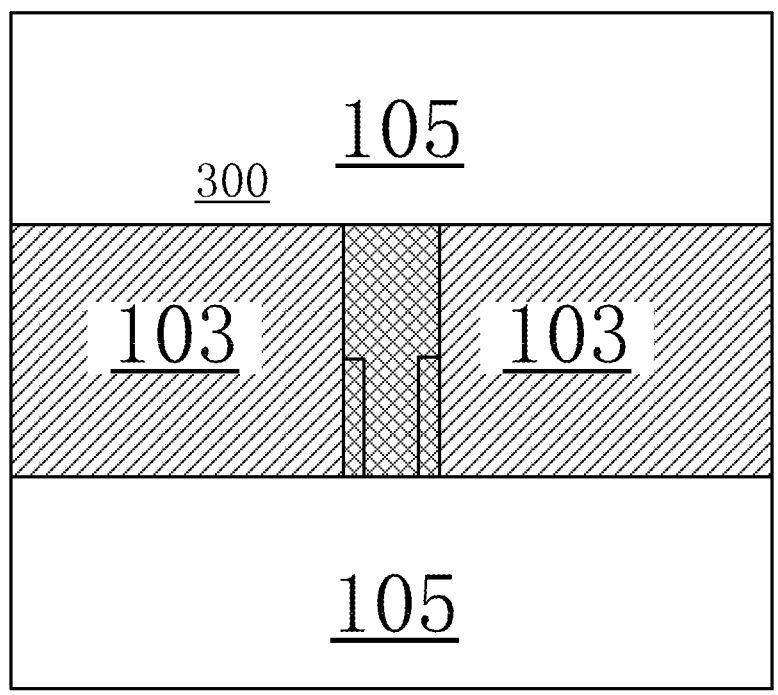
FIG. 11 is a top view of the semiconductor fin structure in FIG. 10.

Next, referring to FIG. 11, a gate dielectric layer 107, a work function tuning layer 108 and a gate electrode layer 109 are deposited in the sacrificial gate vacancy. Specifically, the gate dielectric layer 107 may be an oxide layer including silicon oxide, silicon oxynitride; or a high-k material, for example, any one selected from the group of HfAlON, HfSiAlON, HfTaAlON, HfTiAlON, HfON, HfSiON, HfTaON, HfTiON, Al2O3, La2O3, ZrO2 and LaAlO or any combination thereof. The gate dielectric layer 107 may have a thickness of 1~10 nm, for example, 3 nm, 5 nm or 8 nm. The work function tuning layer 108 may be a single layer or a multiple layer, comprises a material selected from the group of TaN, TaC, TiN, TaAlN, TiAlN, MoAlN, TaTbN, TaErN, TaYbN, TaSiN, HfSiN, MoSiN, RuTax and NiTax or any combination thereof, and ranges in thickness from 10 to 40 nm, for example, 20 nm or 30 m.

Figure 13:
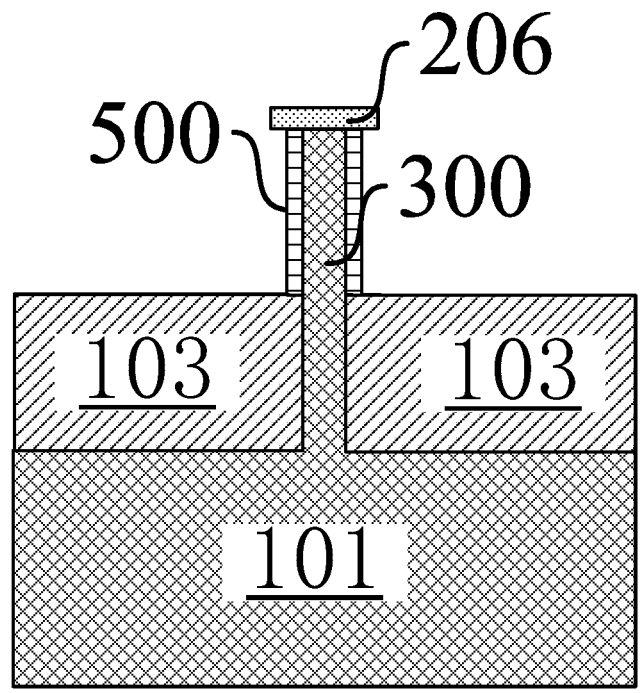

Next, referring to FIG. 13, embodiment 2 of the present invention is described herein: a substrate 101 is provided; a cap layer 206 formed on a portion of the substrate which is defined as a channel region; a fin 102 is formed from the substrate, the channel region is contained in the fin 102 and the width of the fin 102 is defined as a first channel thickness; a shallow trench isolation is formed; a sacrificial gate stack is formed on the top surface and sidewalls of the channel region, and source/drain regions are formed in both ends of the fin 102; an interlayer dielectric layer 105 is deposited and then a planarization process is performed to expose the sacrificial gate stack; the sacrificial gate stack is removed to expose the channel region; a mask 500 is formed on sidewalls of the channel part near the drain side; a semiconductor layer is epitaxially grown from both sides of the exposed channel region from both directions vertical to the sidewalls of the channel until a second channel thickness obtained; then, the cap layer 206 is removed; at last, a gate dielectric layer, a work function tuning layer and a gate electrode metal layer are deposited in order.

In embodiment 2, the original formed width of the fin 102 is the first channel thickness, and the channel region near the source side need to be thickened in later process, which is different from embodiment 1.

Specifically, referring to FIG. 13, after the formation of the cap layer 106, a photoresist layer is deposited on the semiconductor structure and a portion of the photoresist layer that is near the drain side is removed by a mask, and the channel region near the drain side is exposed. Then, a mask 500 is formed on both sides of the exposed channel region. Preferably, the mask 500 may be silicon nitride which is formed by CVD on both sidewalls of the channel region and has a thickness of 10 nm. And then a portion of the mask 500 on both sidewalls of the channel region which needs to be thickened is removed to expose the channel region near the source side. Afterwards, a semiconductor layer is epitaxially grown from the channel region that is not covered by mask 500 from both directions vertical to the sidewalls of the channel until a second channel thickness obtained. Then, the mask 500 is removed. There is no need to repeat other steps shown in embodiment 1.

Compared with embodiment 1, there is difference in embodiment 2: there is no need to etch the channel region near the drain side to obtain the first channel thickness, the channel is made relatively thinner in the initial process while the channel thickness near the source side will be thickened in subsequent steps. Moreover, a temperature of about 800° C. is need when a semiconductor layer is epitaxially grown, while the dopants in the channel region may diffuse in the high temperature, therefore, the method as following to form a cap layer 206 is inappropriate: using ion implantation to form a heavily doped region as a etch-stop layer.

Next, embodiment 3 of the present invention is described herein: a substrate 101 is provided; a cap layer 206 is formed on a portion of the substrate 101 which is defined as a channel region; a fin 102 is formed on the substrate, the channel region is contained in the fin 102 and the width of the fin 102 is defined as a first channel thickness; a shallow trench isolation is formed; a sacrificial gate stack is formed on the top surface and sidewalls of the channel region, and source/drain regions are formed in both ends of the fin 102; a semiconductor layer is epitaxially grown from the source/drain regions in the fin 102 until the source/drain width is 1.5-4 times that of the expected second channel thickness; an interlayer dielectric layer 105 is deposited and a planarization process is performed until the sacrificial gate stack exposed; the sacrificial gate stack is removed to expose the channel region; a mask 500 is formed on sidewalls of the channel region near the drain side; a semiconductor layer is epitaxially grown from the channel region that is not covered by mask 500 from both directions vertical to the sidewalls of the channel until a second channel thickness obtained; then, the cap layer 206 is removed; at last, a gate dielectric layer, a work function tuning layer and a gate electrode metal layer are deposited.

Specifically, similar to embodiment 2, a cap layer 206, a fin 102, a shallow trench isolation, a sacrificial gate stack, source/drain regions are formed on the substrate in order. In the embodiment, the width of the fin 102 is defined as the second channel thickness, in other words, the thickness of initial soure/drain regions is relatively thin and need to be thickened to avoid relatively large parasitic resistor. Therefore, after the source/drain formation, an epitaxial grow is performed with the source/drain regions in the fin 102 as seeding layer to get the same crystal orientation as the source/drain regions. Specifically, the epitaxial grow method may be chemical vapor deposition (CVD), molecular beam epitaxy (MBE) or other method.

The processes after the source/drain regions thickened, for example, interlayer dielectric layer deposition, sacrificial gate stack removing, etc., can refer to embodiment 1 and there is no need to repeat here. According to embodiment 3, the width of the initial fin 102 is the second channel thickness and there is a need to thicken the source/drain regions for purpose of reducing parasitic resistor. In the same way, in embodiment 2, the source/drain regions also can be thickened by epitaxial grow for purpose of reducing parasitic resistor, which will not be repeated here.

According to the embodiments of the present invention, the effects on carrier mobility introduced by channel thickness and undesired effects by DIBL can be reconciled, short channel effects of device can be effectively restrained, and compared to the prior art, the device performance can be effectively improved, the technology complexity can be reduced.

Although the invention has been described with reference to the exemplary embodiments and advantages, it is understood that various changes and replacements and revisions may be made to the embodiments without departing the spirit and scope of the appended claims. For other exemplary embodiments, those skilled in the art may understand the order of the process steps can be changed within the present invention in its aspects.

Further, the present invention is not intend to limited to the particular details described in the specification, such as, technology, mechanism, fabrication, material composition, means, methods and steps. Those skilled in the art will recognize that for those elements already existing or to be developed, such as technology, mechanism, fabrication, material composition, means, methods or steps, if the elements used to be implement a specific function or result similar to the embodiments of the present invention, they can be employed according to the present invention. Therefore, those technology, mechanism, fabrication, material composition, means, methods and steps are in the scope of the appended claims.

We claim:

1. A method of fabricating an asymmetric FinFET, comprising:
   a. providing a substrate (101);
   b. forming a fin (102) on the substrate (101), wherein the width of the fin (102) is defined as a second channel thickness;
   c. forming a shallow trench isolation;
   d. forming a sacrificial gate stack on a top surface and sidewalls of a channel region which is in the middle of the fin, and forming source/drain regions in both ends of the fin;
   e. depositing an interlayer dielectric layer to cover the sacrificial gate stack and the source/drain regions, planarizing the interlayer dielectric layer to expose the sacrificial gate stack;
   f. removing the sacrificial gate stack to expose the channel region;
   g. forming an etch-stop layer (106) on the top surface of the channel region;
   h. covering a photoresist film (400) on a portion of the fin (102) near the source region;
   i. thinning a portion of the fin (102) which is not covered by the photoresist film (400) from both directions vertical to sidewalls of the fin (102) until a first channel thickness is obtained, wherein the second channel thickness of the fin (102) near the source region is thicker than the first channel thickness of the fin (102) near the drain region; and
   j. removing the etch-stop layer (106).

2. A method of fabricating an asymmetric FinFET of claim 1, characterized in that, in step g, the etch-stop layer (106) is formed by forming a P-type heavily doped region on the top of the channel region.

3. A method of fabricating an asymmetric FinFET of claim 2, characterized in that, the heavily doped region is formed by ion implantation.

4. A method of fabricating an asymmetric FinFET of claim 3, characterized in that, ions that are implanted by the ion implantation comprise $BF_2$, a doping concentration of the heavily doped region is 1e19 $cm^{-3}$~5e19 $cm^{-3}$, and an implantation depth of the heavily doped region is 10 nm.

5. A method of fabricating an asymmetric FinFET of claim 1, characterized in that, step g is performed before step b, and the etch-stop layer (106) is formed prior to the fin (102)'s formation.

6. A method of fabricating an asymmetric FinFET of claim 5, characterized in that, in step g, the etch-stop layer (106) is formed by mask deposition.

7. A method of fabricating an asymmetric FinFET of claim 1, characterized in that, in step h, a range of the portion of the semiconductor structure which is covered is ¼~½ channel length along the direction from the borderline of the source region to the channel region.

8. A method of fabricating an asymmetric FinFET of claim 1, characterized in that, in step i, the portion of the fin (102) is thinned by isotropically etching the sidewalls of the fin (102) that are exposed.

9. A method of fabricating an asymmetric FinFET of claim 1, characterized in that, in step i, the portion of the fin (102) is thinned by oxidating the sidewalls of the fin (102) that are exposed.

10. A method of fabricating an asymmetric FinFET of claim 1, characterized in that, the first channel thickness is 5~10 nm.

11. A method of fabricating an asymmetric FinFET of claim 1, characterized in that, the second channel thickness is 10~20 nm.

12. A method of fabricating an asymmetric FinFET of claim 1, characterized in that, subsequent to step j, the method further comprises:
   p. depositing a gate dielectric material, a work function tuning material and a gate metal material.

13. A method of fabricating an asymmetric FinFET, comprising:
   a. providing a substrate (101);
   b. forming a cap layer (206) on top of a portion of the substrate which is defined as a channel region;
   c. forming a fin (102) from the substrate, wherein the channel region is contained in the fin (102) and the width of the fin (102) is defined as a first channel thickness;
   d. forming a shallow trench isolation;
   e. forming a sacrificial gate stack on a top surface and sidewalls of the channel region which is in the middle of the fin, and forming source/drain regions in both ends of the fin;
   f. depositing an interlayer dielectric layer to cover the sacrificial gate stack and the source/drain regions, planarizing the interlayer dielectric layer to expose the sacrificial gate stack;
   g. removing the sacrificial gate stack to expose the channel region;
   h. forming a mask (500) on the sidewalls of the channel region near the drain region;
   i. epitaxially growling a semiconductor layer from exposed sidewalls of the channel region from both directions vertical to the sidewalls of the channel region until a second channel thickness is obtained, wherein the second channel thickness of the fin (102) near the source region is thicker than the first channel thickness of the fin (102) near the drain region; and j. removing the cap layer (206).

14. A method of fabricating an asymmetric FinFET of claim 13, characterized in that, in step b, the cap layer (206) is formed by mask deposition.

15. A method of fabricating an asymmetric FinFET of claim 13, characterized in that, in step h, a length of a portion of the semiconductor structure channel region which is not covered by the mask (500) is ¼~½ of a channel length from the borderline of the source region along the direction from the source region to the channel region.

16. A method of fabricating an asymmetric FinFET of claim 13, characterized in that, in step e, forming the source/drain regions comprises epitaxially growing a semiconductor layer on the source/drain regions in the fin (102) until the width of the source/drain regions is 1.5-4 times the second channel thickness.

17. A method of fabricating an asymmetric FinFET of claim 13 characterized in that, the first channel thickness is 5~10 nm.

18. A method of fabricating an asymmetric FinFET of claim 13, characterized in that, the second channel thickness is 10~20 nm.

19. An asymmetric FinFET, comprising:
a substrate (101);
a fin (102) on the substrate (101);
a shallow trench isolation (103) on the substrate (101), deposited on both sides of the fin (102);
an interlayer dielectric layer (105) covering the shallow trench isolation (103);
a gate stack intersecting with the fin (102) and covering the middle of the fin (102);
source/drain regions in both ends of the fin (102); and
a channel region (300) under the gate stack, deposited in the middle of the fin (102);
wherein a first channel thickness of the fin (102) near the source region is thicker than a second channel thickness of the fin (102) near the drain region.

20. A FinFET according to claim 19, characterized in that, a length of the channel region with the second thickness is ¼~⅔ of a total length of the channel region.

* * * * *

UNITED STATES PATENT AND TRADEMARK OFFICE
CERTIFICATE OF CORRECTION

PATENT NO. : 9,640,660 B2
APPLICATION NO. : 14/900594
DATED : May 2, 2017
INVENTOR(S) : Haizhou Yin et al.

It is certified that error appears in the above-identified patent and that said Letters Patent is hereby corrected as shown below:

In the Claims

Column 10, Lines 20-22, Claim 7, please replace "1/4~1/2 channel length along the direction from the borderline of the source region" with --1/4~1/2 channel length from the source region--.

Column 11, Lines 9-13, in Claim 15, please replace "a length of a portion of the semiconductor structure channel region which is not covered by the mask (500) is 1/4~1/2 of a channel length from the borderline of the source region along the direction from the source region to the channel region" with --a length of a portion of the channel region which is not covered by the mask (500) is 1/4~1/2 of a channel length from the source region to the channel region--.

Signed and Sealed this
Fifteenth Day of August, 2017

Joseph Matal
*Performing the Functions and Duties of the*
*Under Secretary of Commerce for Intellectual Property and*
*Director of the United States Patent and Trademark Office*